(12) United States Patent
Nataraj et al.

(10) Patent No.: US 7,505,295 B1
(45) Date of Patent: Mar. 17, 2009

(54) CONTENT ADDRESSABLE MEMORY WITH MULTI-ROW WRITE FUNCTION

(75) Inventors: Bindiganavale S. Nataraj, Cupertino, CA (US); Sandeep Khanna, Los Altos, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 206 days.

(21) Appl. No.: 10/883,160

(22) Filed: Jul. 1, 2004

(51) Int. Cl.
*G11C 15/00* (2006.01)
*G11C 7/00* (2006.01)

(52) U.S. Cl. ............... 365/49.1; 365/49.16; 365/49.17; 365/49.18; 365/203

(58) Field of Classification Search ............ 365/49, 365/189.07, 203, 189.04, 49.1, 49.11, 49.12, 365/49.13, 50, 49.15, 49.16, 49.17, 49.18; 711/108
See application file for complete search history.

(56) References Cited

U.S. PATENT DOCUMENTS

| | | | |
|---|---|---|---|
| 4,996,666 A | 2/1991 | Duluk, Jr. | |
| 5,321,651 A * | 6/1994 | Monk | 365/49 |
| 5,452,243 A * | 9/1995 | Ansel et al. | 365/49 |
| 5,920,886 A | 7/1999 | Feldmeier | |
| 5,959,929 A | 9/1999 | Cowles et al. | |
| 6,144,574 A * | 11/2000 | Kobayashi et al. | 365/49 |
| 6,237,061 B1 * | 5/2001 | Srinivasan et al. | 711/108 |
| 6,289,414 B1 | 9/2001 | Feldmeier et al. | |
| 6,317,349 B1 * | 11/2001 | Wong | 365/49 |
| 6,344,989 B1 * | 2/2002 | Heile | 365/49 |
| 6,389,506 B1 | 5/2002 | Ross et al. | |
| 6,523,145 B1 * | 2/2003 | Ngo et al. | 365/189.04 |
| 6,560,156 B2 * | 5/2003 | Lien et al. | 365/49 |
| 6,584,002 B1 * | 6/2003 | Brooks et al. | 365/49 |
| 6,700,809 B1 * | 3/2004 | Ng et al. | 365/49 |
| 6,807,077 B2 * | 10/2004 | Noda et al. | 365/49 |
| 6,839,256 B1 * | 1/2005 | Proebsting et al. | 365/49 |
| 6,862,655 B1 * | 3/2005 | Podaima et al. | 365/49 |
| 6,906,937 B1 * | 6/2005 | Nataraj | 365/49 |
| 6,910,097 B1 * | 6/2005 | Srinivasan et al. | 711/108 |
| 6,952,359 B2 * | 10/2005 | Hu | 365/49 |
| 7,002,823 B1 * | 2/2006 | Ichiriu | 365/49 |
| 7,019,999 B1 * | 3/2006 | Srinivasan et al. | 365/49 |
| 2004/0260868 A1 | 12/2004 | Sit et al. | |

* cited by examiner

*Primary Examiner*—Trong Phan
(74) *Attorney, Agent, or Firm*—Shemwell Mahamedi LLP; William L. Paradice, III

(57) ABSTRACT

A content addressable memory (CAM) device having a multi-row write function. The CAM device includes a CAM array and an address circuit. The CAM array includes a plurality of CAM cells and word lines coupled to respective rows of the CAM cells. The address circuit is coupled to the CAM array and configured to activate a plurality of the word lines simultaneously to enable a write value to be stored within a selected plurality of the rows of CAM cells.

27 Claims, 6 Drawing Sheets

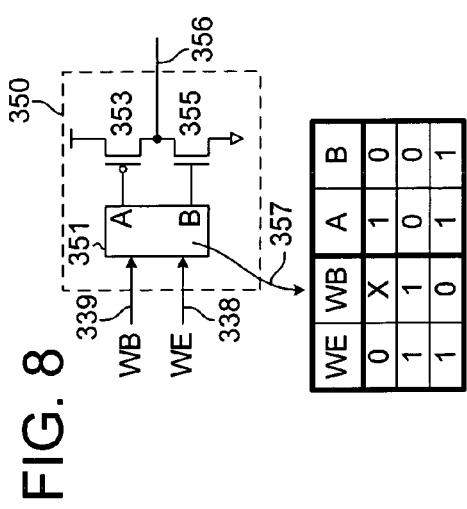

CONTENT ADDRESSABLE MEMORY WITH MULTI-ROW WRITE FUNCTION

FIELD OF THE INVENTION

The present invention relates generally to content addressable memory devices, and more particularly to ternary content addressable memory devices.

BACKGROUND

Content addressable memory (CAM) devices are often used in network switching and routing systems to determine forwarding destinations and permissions for data packets. A CAM device can be instructed to compare search data obtained from an incoming packet with contents of a forwarding or classification database stored in an associative storage array within the CAM device. If the search data matches an entry in the database, the CAM device generates a match address that corresponds to the location of the matching entry, and asserts a match flag to signal the match. The match address is then typically used to address another storage array, either within or separate from the CAM device, to retrieve a forwarding address or other routing information for the packet.

The associative storage array of a CAM device, a CAM array, is typically populated with CAM cells arranged in rows and columns. Precharged match lines are coupled to respective rows of the CAM cells, and bit line pairs and compare line pairs are coupled to respective columns of the CAM cells. Together, the bit line pairs form a data port for read and write access to address-selected rows of CAM cells, and the compare line pairs form a compare port for inputting search data to the CAM array during search operations. The CAM cells themselves are specialized store-and-compare circuits each including a data storage element to store a constituent data bit of a database entry and a compare circuit for comparing the data bit with a search bit presented on the compare lines. In a typical arrangement, the compare circuits within the CAM cells of a given row are coupled in parallel to the match line for the row, with each compare circuit switchably forming a discharge path to discharge the match line if the data bit and search bit do not match. By this arrangement if any one bit of a database entry does not match the corresponding bit of the search data, the match line for the row is discharged to signal the mismatch. If all the bits of the database entry match the corresponding bits of the search data, the match line remains in its precharged state to signal a match. Because search data is presented to all the rows of CAM cells in each compare operation, a rapid, parallel search for a matching database entry is performed.

In a prior-art ternary CAM array, depicted in FIG. 1, each CAM cell 103 typically includes a mask storage element (MS) to permit storage of a mask state (also called a "don't care" state) in addition to the binary '1' and '0' states stored in the data storage element (DS). The masked state is effected by loading the mask storage element with a mask bit that prevents the compare circuit (CP) from signaling a mismatch between the stored data bit and a search bit (i.e., complementary signals C and /C). Because both mask and data storage elements are provided in each CAM cell, the ternary CAM array provides the flexibility to apply an individually tailored mask pattern to each entry in the database. That is, mask words and data words are stored one-for-one within the ternary CAM array 101 as shown in FIG. 1. In some applications, however, it may be necessary to apply the same mask word to multiple data words. In the CAM application shown in FIG. 2, for example, a set of Z mask words (Mask 1, Mask 2, ..., Mask Z) are applied, respectively, to Z different mask address ranges (Address Range 1 through Address range Z), with each address range corresponding to multiple rows of CAM cells. Unfortunately, achieving such an arrangement in the ternary CAM array 101 requires that each mask word be stored repeatedly in a sequence of mask write operations directed to each of the addresses within the corresponding mask address range. Repeated storage of the same mask word at different addresses undesirably consumes system resources as a host device must usually initiate a write operation directed to each different address within each different mask range (i.e., providing an instruction, address and mask value for each write operation) and in some cases may also read back each mask word to confirm proper storage.

FIG. 3 illustrates a portion of another prior-art CAM array 160 referred to herein as a shared-mask CAM array. As shown, instead of providing a distinct set of mask storage elements within each row of CAM cells, a row of mask storage elements 163 is shared among multiple rows of CAM cells 161. By this arrangement, a single mask write operation directed to a single row of mask storage elements 163 may be used to store a mask word that is applied across multiple rows of CAM cells (i.e., a range of addresses), thus reducing the number of mask write instructions that need to be issued to apply the same mask word across a given range of addresses. Unfortunately, the shared-mask CAM array 160 is often unsuitable in applications that require different or potentially different mask words to be stored for each data word.

BRIEF DESCRIPTION OF THE DRAWINGS

The present invention is illustrated by way of example, and not by way of limitation, in the figures of the accompanying drawings and in which like reference numerals refer to similar elements and in which:

FIG. 8 illustrates an embodiment of a line driver that may be used within the differential driver of FIG. 7;

FIG. 9 illustrates an alternative embodiment of a line driver that may be used within the differential driver of FIG. 7;

FIG. 10 illustrates an embodiment of a precharge element that may be used to implement the data bit line precharge elements within the bit-line precharge circuit of FIG. 7;

FIG. 11 illustrates a current sinking circuit that may be used within the line driver of FIG. 9 to enable selection of different levels of added discharge current; and FIG. 12 illustrates a current sourcing circuit that may be used within the precharge element of FIG. 10 to enable selection of different levels of added charging current.

DETAILED DESCRIPTION

Figure 1:
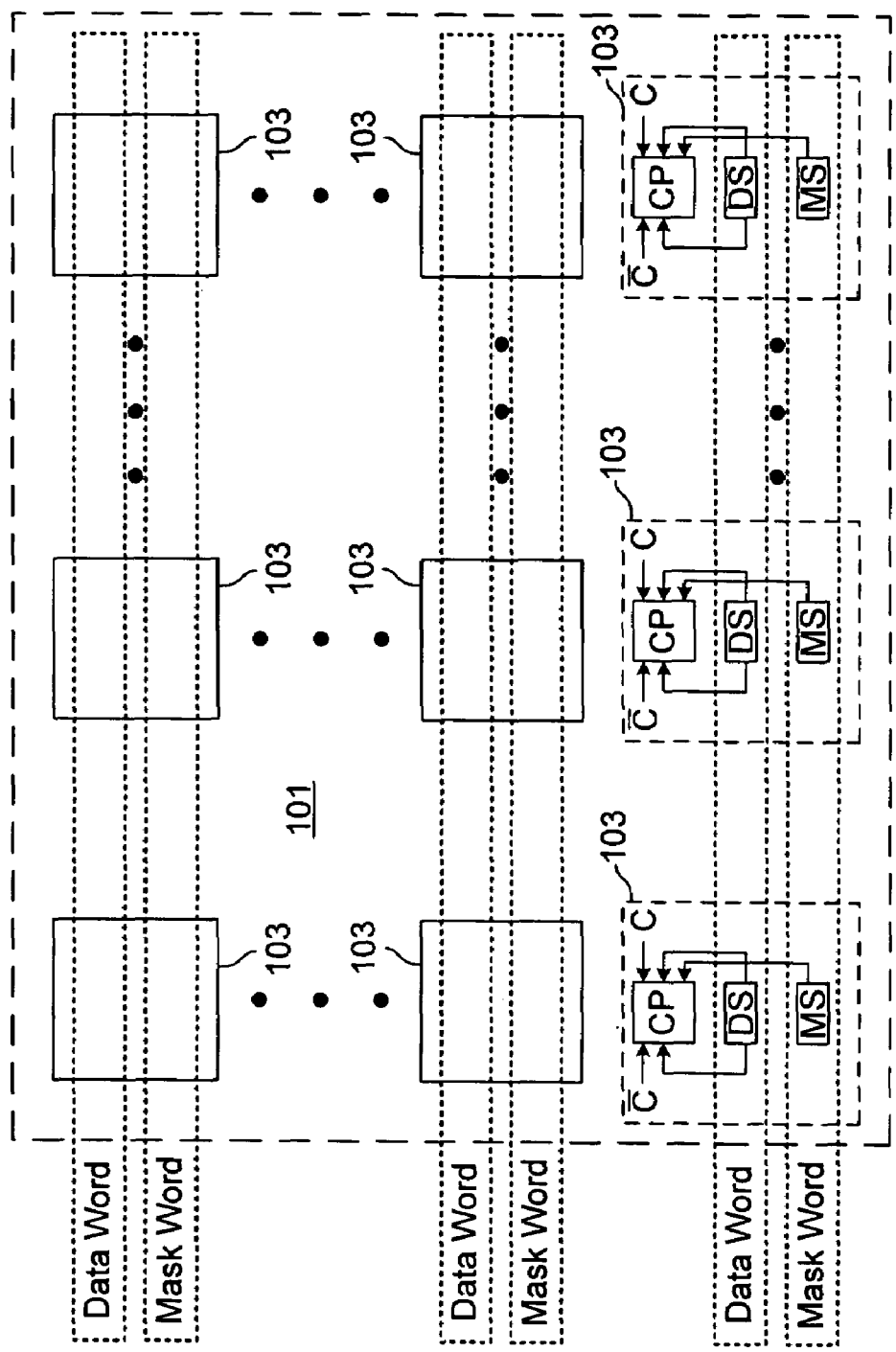
FIG. 1 illustrates a prior-art ternary CAM array.
Figure 3:
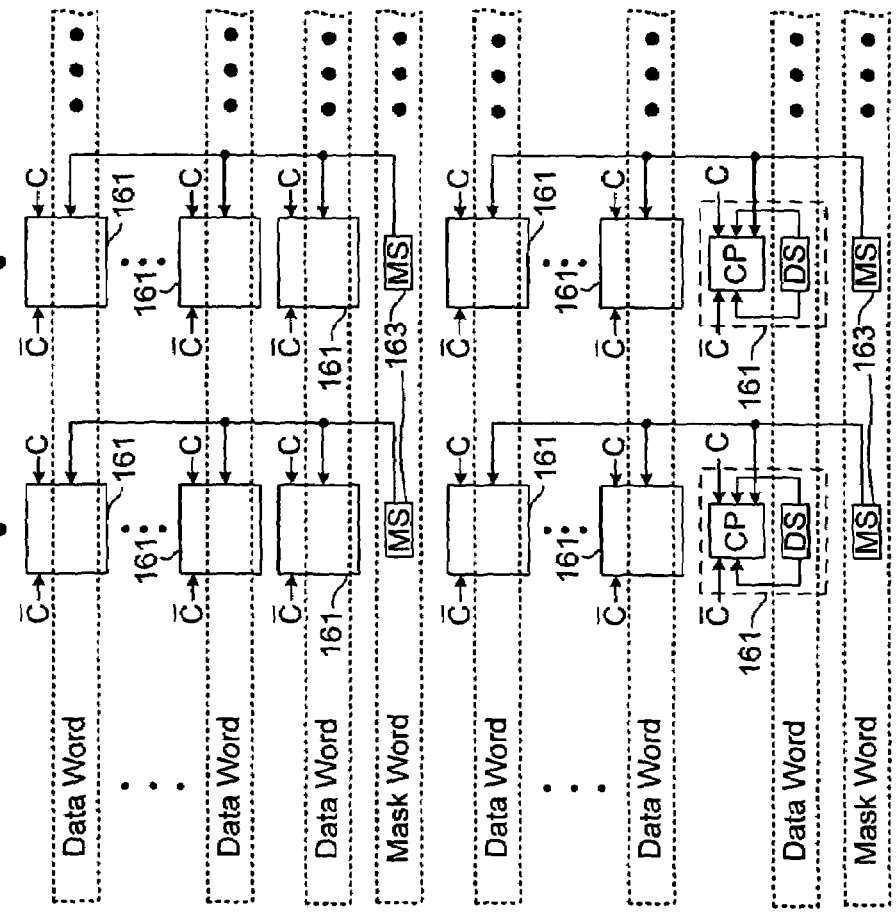
FIG. 3 illustrates a portion of another prior-art CAM array.
Figure 2:
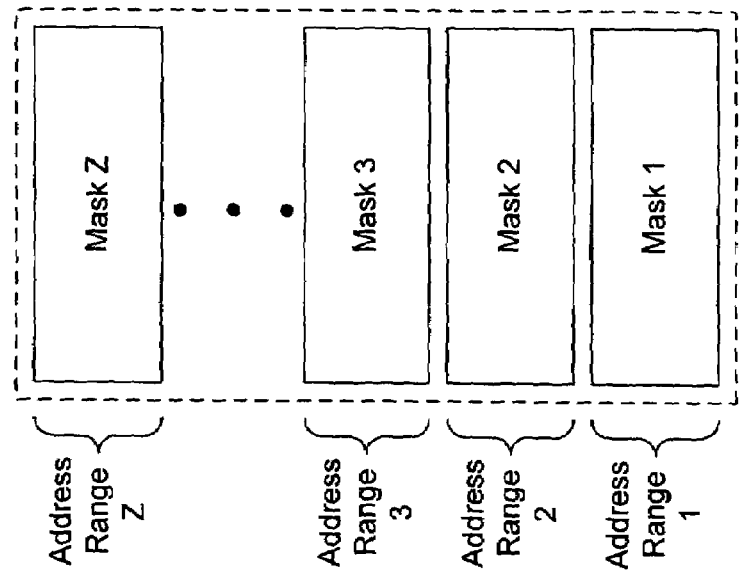
FIG. 2 illustrates a prior-art CAM application in which mask words are applied to respective address ranges.

In the following description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single-conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '$\overline{\text{<signalname>}}$') is also used to indicate an active low signal. The term "terminal" is used to mean a point of electrical connection. The term "exemplary" is used herein to express but an example, and not a preference or requirement.

In embodiments of the present invention, enhanced write control circuitry is provided within a ternary CAM device to enable storage of a mask value simultaneously in multiple rows of CAM cells, an operation referred to herein as a multi-row write. In one embodiment, a multi-row write operation is carried out within the CAM device in response to an instruction from a host device (i.e., a control processor, network processor, application-specific integrated circuit (ASIC), or other control device) so that selection between single-row write operations and multi-row write operations may be made on an instruction-by-instruction basis by the host device. Thus, if the CAM device is to be used in a full-ternary application in which no mask sharing is needed, no multi-row write operations need be issued by the host device. If the CAM device is to be used in an application in which a mask is shared among multiple rows of CAM cells, multi-row write instructions may be issued to reduce the overall number of write instructions issued to the CAM device, thus reducing the burden on system resources. In yet other applications, the CAM device may include multiple CAM arrays (and/or a segmented CAM array) some of which are loaded using multi-row write operations while others are loaded using a combination of multi-row and single-row write operations or only single-row write operations. In an alternative embodiment, a configuration circuit (e.g., a programmable register) is programmed by a host device to select either a multi-row write mode or a single-row write mode, the enhanced write control circuitry being responsive to the programmed mode to carry out either multi-row or single-row write operations. In other embodiments, the number of rows of CAM cells written in a multi-row write operation may be established by programming a group-size value within a configuration circuit or by providing a group-size value with a multi-row write instruction. These and other aspects and embodiments of the invention are described below.

CAM Device with Multi-Row Write Function

Figure 4:
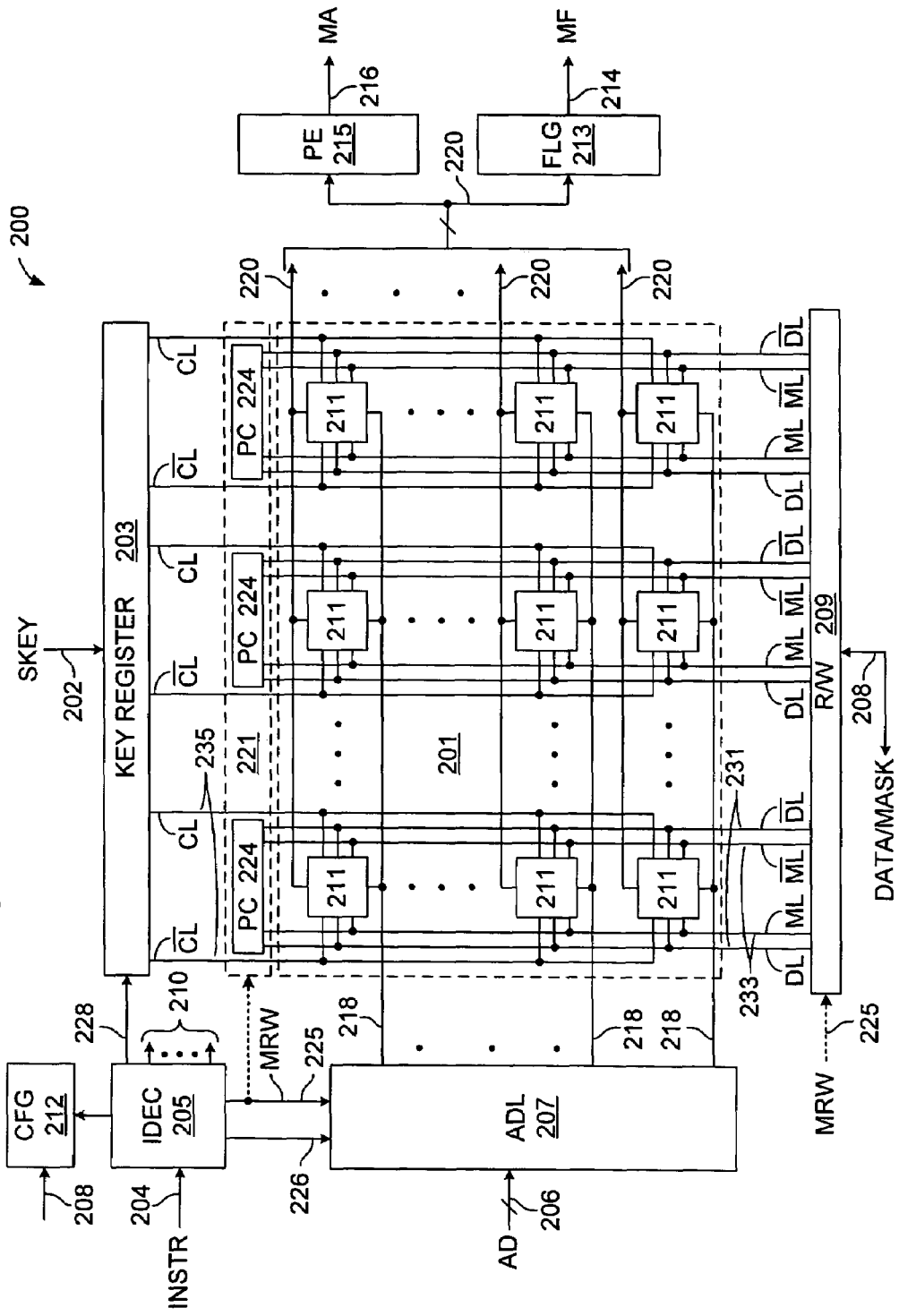
FIG. 4 illustrates a CAM device having a multi-row write function according to an embodiment of the invention.

FIG. 4 illustrates a CAM device 200 having a multi-row write function according to an embodiment of the invention. The CAM device includes a CAM array 201, key register 203, instruction decoder 205, address logic 207, read/write circuit 209, array precharge circuit 221, configuration circuit 212, flag circuit 213 and priority encoder 215. The CAM device 200 may also include other circuit blocks, not shown, for performing error checking functions, database maintenance, self-testing and so forth. The CAM device 200 includes interfaces to a number of signal paths 202, 204, 206, 208 to receive instructions, addresses, search keys, write values, and so forth, and to output read values, search results, status values and the like to one or more other devices (e.g., host device, associated memory). The signals received or transmitted on individual signal paths are discussed below in the context of the operations and circuit blocks to which they pertain. In alternative embodiments, any one or more of the signal paths and corresponding interfaces may be eliminated, and the signals carried on the eliminated signal paths multiplexed onto one or more others of the signal paths.

The instruction decoder 205 serves as a control circuit for the CAM device 200, decoding instructions received via an instruction bus 204 and issuing various control and timing signals (shown generally at 210) to other circuit blocks within the CAM device 200 as necessary to carry out the indicated operation. The instruction decoder 205 may be implemented by a state machine, micro-sequencer, or any other type of control circuit and may receive or generate one or more clock signals (not shown) for synchronizing state transitions and/or other timing control purposes. Also, virtually any type of instructions may be received and decoded by the instruction decoder 205 including, without limitation, search instructions, data read and write instructions, mask read and write instructions (including multi-row write instructions), configuration instructions (i.e., instructing the CAM device to program a configuration value within the configuration circuit), test instructions and so forth. Individual control and timing signals issued by the instruction decoder 205 in response to the various instructions are discussed below in the context of the particular operations and circuit blocks to which they pertain.

CAM array 201 is a ternary CAM array having a plurality of ternary CAM cells 211 arranged in rows and columns. Each row of CAM cells (a CAM row) is coupled to a respective word line 218 and precharged match line 220 (the match line precharging circuit is not specifically shown in FIG. 4), and each column of CAM cells (a CAM column) is coupled to a respective pair of compare lines 235 (CL and /CL), a respective pair of data bit lines 231 (DL and /DL), and a respective pair of match bit lines 233 (ML and /ML). The ternary CAM cells 211 each include a data storage element switchably coupled (i.e., coupled through transistor switches or other switching elements) to the data bit lines 231 for the CAM column, and a mask storage element switchably coupled to the mask bit lines 233 for the CAM column. The data storage element and mask storage element enable storage of data bit (D) and mask bit (M), respectively, that collectively represent one of three states: logic '1' (e.g., D=1, M=0), logic '0' (e.g., D=0, M=0), and a mask state, 'X' (e.g., D=0 or 1, M=1), where 'X' indicates a don't care condition. The data and mask storage elements within ternary CAM cells 211 may be implemented by virtually any type of storage circuit including, without limitation, volatile storage circuits (e.g., back-to-back coupled inverters, thyristor-based storage or other static volatile storage circuit; or capacitor-based or other dynamic storage circuits) and non-volatile storage circuits (e.g., floating-gate-based storage elements such as flash memory, ferroelectric storage elements, battery backed memory, etc).

In one embodiment, the CAM array 201 includes multiple segments that may be combined according to logical dimension information (e.g., stored within the configuration circuit 212 or provided in host-supplied instructions) to effect different logical array configurations. In one implementation, for example, a 288-bit wide, 1024 row CAM array includes four 72-bit segments which may be accessed individually (allowing storage of four database entries per row and effecting a 72×4096 logical array dimension), in pairs (allowing storage of two database entries per row and effecting a 144×2048 logical array dimension) or as a unit (allowing storage of a single 288-bit database entry in each row and effecting a 288×1024 logical array dimension). Other physical and logical CAM array dimensions may be provided in alternative embodiments. Also, different logical dimensions may be applied in different portions of the CAM array 201 and/or, in an embodiment having multiple CAM arrays 201 within a single CAM device, different logical dimensions may be applied to different CAM arrays 201.

Still referring to FIG. 4, the key register 203 is used to store search keys (i.e., search data values) received via a search bus 202, and includes compare line driver circuitry coupled to compare line pair 235 for each CAM column. Upon decoding a search instruction, the instruction decoder 205 initiates a search operation by outputting a search enable signal 228 to the key register 203, thereby enabling the compare line driver circuitry to drive constituent bits of a search key (i.e., comparand bits) in complementary form onto the compare line pairs 235 of the CAM array 201. After a predetermined time interval (e.g., after one or more clock signal transitions and/or after an asynchronous delay interval), the search enable signal 228 is deasserted to allow the charged compare lines to discharge in preparation for a subsequent compare operation. Though not specifically shown in FIG. 4, global masking circuitry may be provided and used to selectively prevent compare lines from being driven for one or more columns of CAM cells 211, thereby masking the corresponding bit positions in all the rows of the CAM array 201. In an alternative embodiment, the key register 203 may be omitted and the comparand bits sourced directly from the search bus 202.

The comparand bits driven onto the compare line pairs are compared with data values stored within individual ternary CAM cells 211 which, as discussed above, may be masked to prevent mismatch detection. If each CAM cell 211 within a given CAM row indicates a match between the comparand bit and stored data value (i.e., due to logical match, or masking), the match line 220 for the CAM row remains in its precharged state to signal the match condition. If a mismatch is detected in one or more CAM cells 211 of a given CAM row, the mismatch-detecting CAM cell (or cells) forms a path to ground to discharge the match line 220 for the row and thereby signal the mismatch condition. In alternative embodiments, CAM cells 211 may be coupled in series with a pulled-up match line 220 and a mismatch-detecting CAM cell 211 used to interrupt a connection to ground (i.e., in such an embodiment a charged match line 220 may indicate a mismatch condition, while a discharged match line 220 indicates a match condition). Also, regardless of whether the CAM cells 211 are coupled in parallel or series with the match lines 220, the logical states of the match lines 220 used to signal match and mismatch conditions may be reversed in alternative embodiments (e.g., by swapping logic low and logic high voltage connections).

Still referring to FIG. 4, the flag circuit 213 and priority encoder 215 are both coupled to the match lines 220 to receive match indications therefrom. In one embodiment, the flag circuit 213 asserts a match flag 214 (MF) if any of the match lines 220 indicate a match condition during a search operation. The flag circuit 213 may additionally assert a multiple match flag (not shown) if two or more match lines 220 indicate match conditions. Also, during read and write operations, the match lines may be driven high or low according to whether the corresponding CAM row contains a valid entry, and the match flag 214 may therefore be used to signal a full condition within the CAM array 201 (i.e., all rows of CAM cells 211 occupied by a valid entry). The flag circuit 213 may additionally output an almost-full flag during read and write operations to indicate, for example, that the CAM array 201 is within a predetermined number of entries of being completely filled.

The priority encoder 215 responds to match indications signaled on the match lines 220 by determining a highest-priority matching (HPM) entry (i.e., highest-priority database entry indicated to match the search value), and generating a match address 216 (MA) that corresponds to the storage location of the HPM entry within the CAM array 201. The priority determination may be based on various different criteria including, without limitation, the numerical value of the addresses associated with the key-matching entries (e.g., lower numerical address taking priority over higher numerical address, or vice-versa), the number of unmasked bits within the key-matching entries (e.g., entry having fewer masked bits taking priority over entry having more masked bits, or vice-versa), age of key-matching entries, logical tags within the key-matching entries and so forth. Also, the priority encoder 215 may be programmable to allow relative priorities of database entries to be established by programming (i.e., storing) a priority value for each database entry. However match indications are prioritized, the resulting match address 216 may be used to index another storage array within or separate from the CAM device 200, and may also be recorded within an address register (not shown in FIG. 4) within the CAM device 200 to enable read and write access to the HPM entry for error-checking and other purposes. Also, as discussed above, the match lines 220 may be driven high or low during read and write operations to indicate whether the corresponding CAM row contains a valid entry. The priority encoder 215 may encode the validity indications to generate an address that corresponds to the highest-priority unused storage location within the CAM array 201, an address referred to herein as a next free address (NFA).

The address logic 207 and read/write circuit 209 are used to carry out data access operations within the CAM array 201, including data read and write operations and mask read and write operations, the mask write operations including single-row write operations and multi-row write operations. Data access operations may be initiated by the instruction decoder 205 in response to host read and write instructions or in response to internal states such as detecting a lapse in the stream of host read/write instructions (indicating that read/write cycles are available), error detection (i.e., indicating that one or more entries within the CAM array are corrupted and may need to be invalidated and/or overwritten with noncorrupted data) and so forth. In the embodiment of FIG. 4, the instruction decoder 205 initiates a data access operation by issuing a decode enable signal 226 to the address logic 207 to enable the address logic 207 to decode an address value (AD) received via address bus 206 (or from an internal source such as a register used to store an HPM address, next free address, or from a counter or other address generator used to generate a sequence of addresses for error checking or auto-loading purposes), and by issuing control signals to the read/write circuit 209 to enable the read/write circuit to drive a write value or sense a read value on the data bit lines 231 and/or mask bit lines 233.

In a read operation, data write operation or single-row mask write operation, the address logic 207 activates an address-specified word line 218 to enable read or write access to the mask and/or data storage elements within the corresponding CAM row. More specifically, in a read operation, word line activation enables the contents of the storage elements (i.e., the data and mask words) within the CAM cells of the corresponding CAM row to be output onto the data bit line pairs 231 and mask bit line pairs 233, respectively, the bit line pairs for each CAM column being precharged by respective bit-line precharge circuits 224 (PC) within array precharge circuit 221 (as discussed below, the multi-row write signal 225 (MRW) may be supplied to selected precharge elements within bit-line precharge circuits 224 to boost the precharge for unused bit lines during a multi-row write). After a predetermined (or clocked) settling interval, the instruction decoder (or other control logic) asserts a read strobe signal to enable sense amplifiers within the read/write circuit 209 to amplify the data word and/or mask word presented on the data bit lines 231 and mask bit lines 233 to logic levels. The logic level data word and/or mask word may then be output from the CAM device 200 via data bus 208 and may additionally or alternatively be provided to other circuitry within the CAM device 200, such as error checking circuitry (e.g., to check for parity errors, cyclic-redundancy check errors, checksum errors, error correction code errors and so forth). As discussed below, in one embodiment, a bank of sense amplifiers is shared between the data bit lines 231 and mask bit lines 233 so that either a mask word (MASK) or data word (DATA, collectively DATA/MASK) is read in a given read operation. In an alternative embodiment, separate banks of sense amplifiers may be coupled to the data bit lines 231 and mask bit lines 233 to enable both mask and data words to be read simultaneously from a selected CAM row.

In a single-row write operation, a bank of differential write drivers within the read/write circuit 209 are enabled to drive a write value (e.g., received via data bus 208) onto the data bit lines 231 and/or mask bit lines 233 of the CAM array 200, thereby enabling storage of the write value in the data storage elements and/or mask storage elements of the address-selected CAM row (i.e., the CAM row coupled to the activated word line). In one embodiment, a single bank of differential write drivers is shared between the data bit lines 231 and mask bit lines 233 so that either a data word or a mask word is written in a given single-row write operation. In an alternative embodiment, separate differential write driver banks may be coupled to the data bit lines 231 and mask bit lines 233 to enable both mask and data words to be written simultaneously within the address-selected CAM row.

In the case of a multi-row write operation, the read/write circuit 209 drives a mask word onto the mask bit lines 233, and the address logic 207 activates multiple address-selected word lines to store the mask word simultaneously within multiple CAM rows. In the particular embodiment of FIG. 4, multi-row write operations may be used, for example, to store a mask word in multiple CAM rows in response to a single write instruction from a host device, thereby reducing the number of write instructions issued by the host device to establish a common mask word for a given address range within the CAM device 200 (i.e., effectively emulating the operation of a shared-mask embodiment). Because distinct mask words may be stored within each CAM row, however, the CAM device 200 may still be used in ternary CAM applications that require different or potentially different mask words to be stored for each data word.

Still referring to FIG. 4, configuration circuit 212 may be used to store device configuration information of various types including, without limitation, group-size information to indicate how many rows of CAM cells are to be accessed in a multi-row write operation (e.g., how many word lines are to be activated simultaneously), logical dimension information, timing control information, test option selections, match prioritizing policy, and so forth. The configuration circuit 212 may be programmed in a one-time programmable programming operation (e.g., blowing fusible elements in a production-time programming operation) or in one or more run-time programming operations in response to a host-supplied programming instruction and configuration information.

Multi-Row Address Decoder

Figure 5:
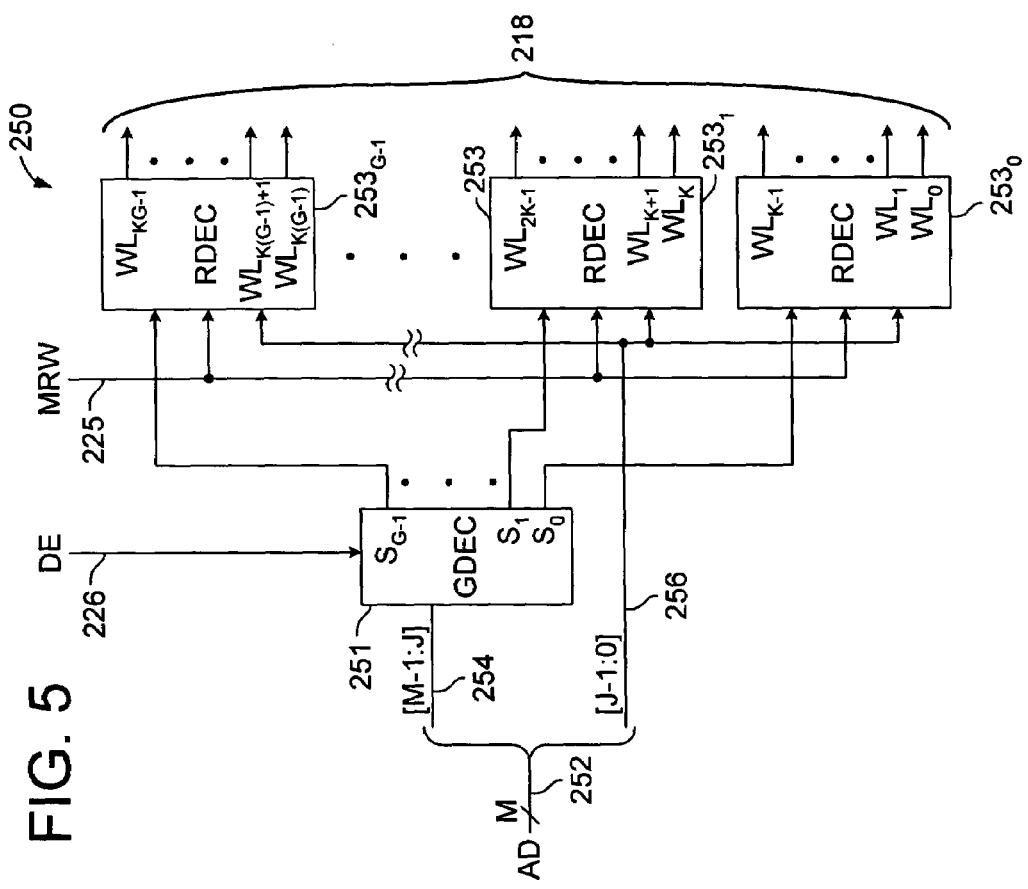
FIG. 5 illustrates an embodiment of an address decoder that may be used within the address logic of FIG. 4 to support multi-row write operations.

FIG. 5 illustrates an embodiment of an address decoder 250 that may be used within the address logic 207 of FIG. 4 to support multi-row write operations. The address decoder 250 includes a group decoder 251 (GDEC) and a set of row decoders $253_0$-$253_{G-1}$ (RDEC). The group decoder 251 is coupled to receive a group address component 254 of an M-bit row address 252 (AD [M−1:0]) and a decode enable signal 226 (DE) from the instruction decoder. In the embodiment of FIG. 5, the group address 254 includes the R most significant bits of the row address 252 (i.e., row address AD [M−1:J], where M−J=R). In an alternative embodiment, the group address 254 may include any combination of bits from the row address 252.

When the decode enable signal 226 is asserted, the group decoder 251 performs an R-to-G binary decoding operation, activating one of G group select lines $S_0$-$S_{G-1}$ in accordance with the group address 254 (e.g., activating group select line $S_i$, where 'i' ranges from 0 to $2^R-1$ according to the numeric value of the group address 254). Each of the row decoders $253_0$-$253_{G-1}$ includes a group select input coupled to a respective one of the group select lines, $S_0$-$S_{G-1}$, an address input to receive a sub-group address 256 (e.g., the J least significant bits [J−1:0] of the row address 252 in the embodiment of FIG. 5 or, alternatively, if not the least significant row address bits, whichever row address bits do not form part of the group address 254), and a multi-row write input coupled to receive a multi-row write signal 225 (MRW) from the instruction decoder. When a group select line is activated, the corresponding row decoder 253 is enabled to activate one or more of a group of K word lines 218, depending on the state of the multi-row write signal 225 and sub-group address 256. More specifically, if the multi-row write signal 225 is deasserted, then the enabled row decoder performs a J-to-K decode operation to activate one of the K word lines 218 in accordance with the sub-group address value. For example, if group select line $S_0$ is activated (and multi-row write signal 225 is deasserted), then row decoder $253_0$ activates one of word lines $WL_0$-$WL_{K-1}$ according to the sub-group address 256. If group select line $S_1$ is activated, then row decoder $253_1$ activates one of word lines $WL_K$-$WL_{2K-1}$ according to the sub-group address 256, and so forth to row decoder $253_{G-1}$ which activates one of word lines $WL_{K(G-1)}$-$WL_{(KG)-1}$ in response to activation of group select line $S_{G-1}$. Thus, when the decode enable signal 226 is asserted and the multi-row write signal 225 is deasserted, the address decoder 250 activates one of N word lines indicated by the M-bit row address 252, where $N=K*G=2^M$.

If the multi-row write signal 225 is asserted during a decode operation, the enabled row decoder 253 (i.e., the row decoder 253 coupled to the activated group select line) activates each of the K word lines of the selected group to enable multi-row write access to the corresponding group of CAM rows. That is, if group select line $S_0$ is activated (and multi-row write signal 225 is asserted), row decoder $253_0$ activates word lines $WL_0$-$WL_{K-1}$ to enable a multi-row write within a first group of K CAM rows. If group select line $S_1$ is activated, row decoder $253_1$ activates word lines $WL_K$-$WL_{2K-1}$ to enable a multi-row write within a second group of K CAM rows, and so forth for each group of CAM rows coupled to word lines driven by row decoders $253_2$-$253_{G-1}$.

Figure 6:
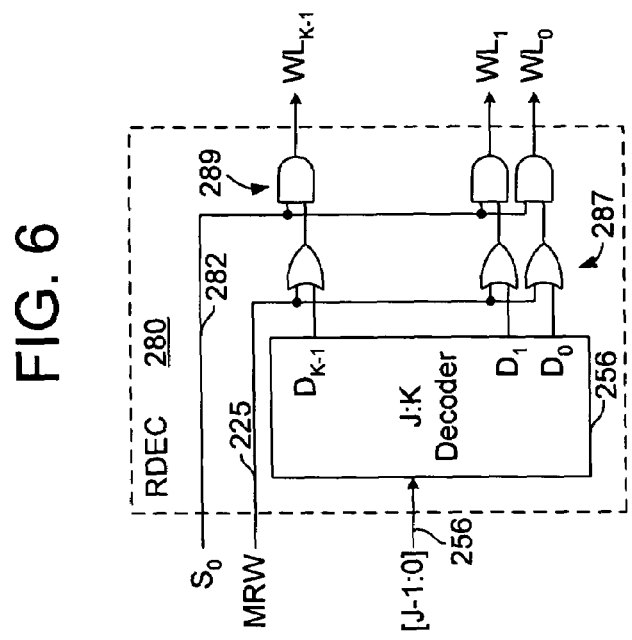
FIG. 6 illustrates an embodiment of a row decoder that may be used to implement the row decoders of FIG. 5.

FIG. 6 illustrates an embodiment of a row decoder 280 (RDEC) that may be used to implement the row decoders 253 of FIG. 5. The row decoder 280 includes a J-to-K binary decoder (J:K Decoder) (i.e., $K=2^J$) to activate one of K output lines, $D_0$-$D_{K-1}$ according to the incoming sub-group address 256 [J–1:0]. The $D_0$-$D_{K-1}$ output lines are coupled to first inputs of respective OR gates 287 so that the activated one of the output lines will raise the output of the corresponding OR gate 287. The second inputs of the OR gates 287 are coupled to receive the multi-row write signal 225 (MRW) so that, if the multi-row write signal 225 is asserted, the outputs of all the OR gates 287 will go high. The outputs of the OR gates 287 are coupled to first inputs of respective AND gates 289, and the second inputs of the AND gates are coupled to receive a group select signal 282 ($S_0$ in this example). The outputs of the AND gates 289 are coupled to word lines so that, if the group select signal 282 is asserted, and the multi-row write signal 225 is deasserted, one of the word lines $WL_0$-$WL_{K-1}$ is activated in accordance with the sub-group address 256. If the group select signal 282 and multi-row write signal 225 are both asserted, then all the word lines $WL_0$-$WL_{K-1}$ are activated. If the group select signal 282 is deasserted, none of the word lines are activated.

Referring to FIGS. 5 and 6, it should be noted that numerous different logic circuits may be used to decode the row address 252 (and the group address 254 and sub-group address 256). Also, the number of word lines activated during a multi-row write operation may be controlled by a mode setting within the configuration circuit (e.g., element 212 of FIG. 4) and/or according to incoming instructions, thereby enabling the number of rows written to in a multi-row write operation to vary from one mask write operation to the next according to application needs. As an example, in one embodiment, the multi-row write signal 225 is a multi-bit signal having x4 and x8 constituent signals to enable selection between single-row write operations, four-row write operations and eight-row write operations as shown in the following table (A0, A1 and A2 being the least significant bits of an M-bit row address and $WL_0$-$WL_7$ being the eight word lines coupled to a given row decoder):

TABLE 1

| x8 | x4 | A2 | A1 | A0 | WL7 | WL6 | WL5 | WL4 | WL3 | WL2 | WL1 | WL0 |
|---|---|---|---|---|---|---|---|---|---|---|---|---|
| 0 | 0 | 0 | 0 | 0 | 0 | 0 | 0 | 0 | 0 | 0 | 0 | 1 |
| 0 | 0 | 0 | 0 | 1 | 0 | 0 | 0 | 0 | 0 | 0 | 1 | 0 |
| 0 | 0 | 0 | 1 | 0 | 0 | 0 | 0 | 0 | 0 | 1 | 0 | 0 |
| 0 | 0 | 0 | 1 | 1 | 0 | 0 | 0 | 0 | 1 | 0 | 0 | 0 |
| 0 | 0 | 1 | 0 | 0 | 0 | 0 | 0 | 1 | 0 | 0 | 0 | 0 |
| 0 | 0 | 1 | 0 | 1 | 0 | 0 | 1 | 0 | 0 | 0 | 0 | 0 |
| 0 | 0 | 1 | 1 | 0 | 0 | 1 | 0 | 0 | 0 | 0 | 0 | 0 |
| 0 | 0 | 1 | 1 | 1 | 1 | 0 | 0 | 0 | 0 | 0 | 0 | 0 |
| 0 | 1 | 0 | X | X | 0 | 0 | 0 | 0 | 1 | 1 | 1 | 1 |
| 0 | 1 | 1 | X | X | 1 | 1 | 1 | 1 | 0 | 0 | 0 | 0 |
| 1 | X | X | X | X | 1 | 1 | 1 | 1 | 1 | 1 | 1 | 1 |

Additional and/or different group-size selections or may be used in alternative embodiments.

Enhanced Bit-Line Driver

Figure 7:
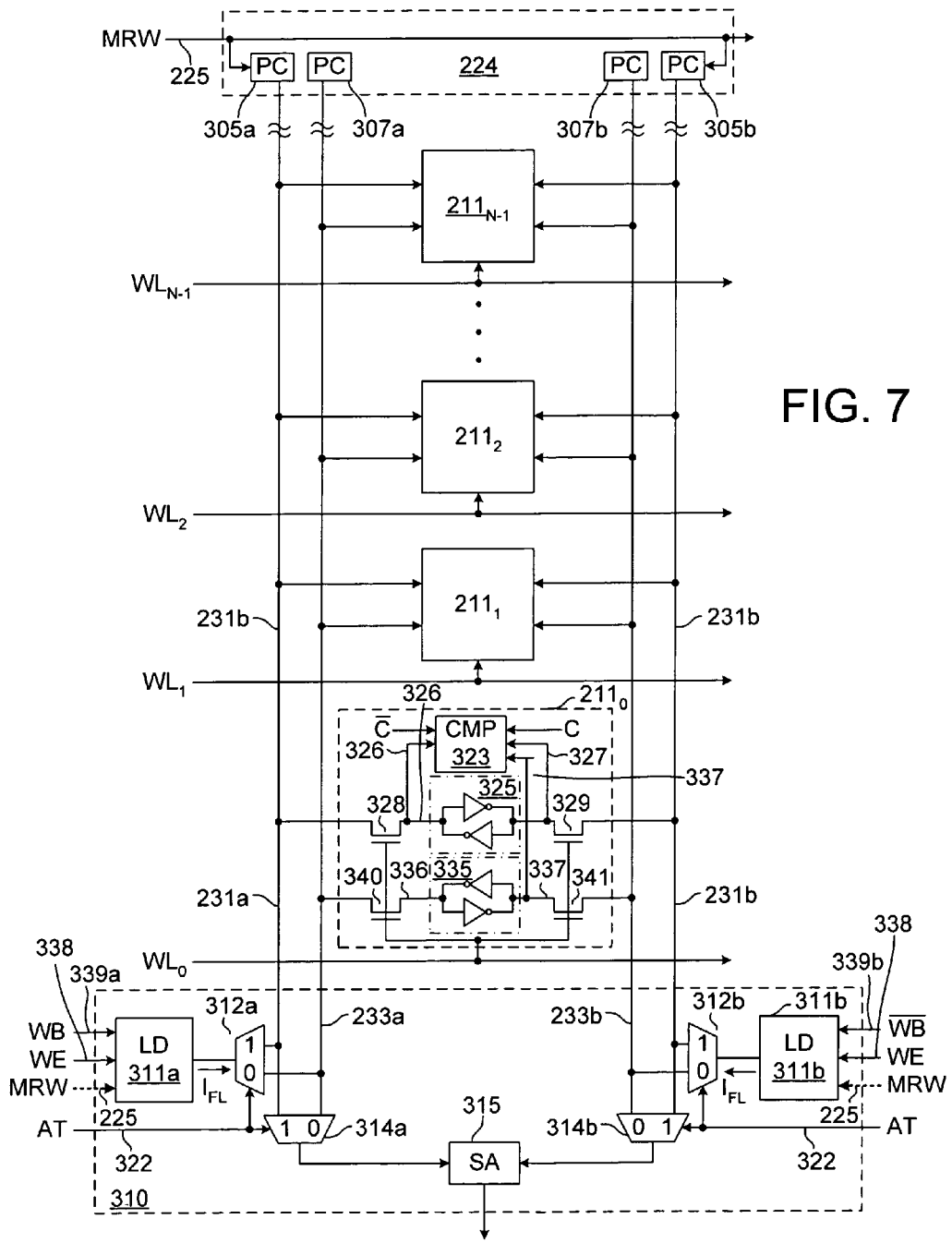
FIG. 7 illustrates a column of CAM cells, bit-line driver/amplifier and bit-line precharge circuit according to an embodiment of the invention.

FIG. 7 illustrates a column of CAM cells $211_0$-$211_{N-1}$, bit-line driver/amplifier 310 and bit-line precharge circuit 224 according to an embodiment of the invention. Referring to the detail view of CAM cell $211_0$, each of the CAM cells 211 is a ternary CAM cell having a compare circuit 323, data storage element 325 and mask storage element 335. In the particular embodiment shown, the mask and data storage elements 325 and 335 are each implemented by back-to-back coupled inverters having inverting and non-inverting nodes. The non-inverting node 326 and inverting node 327 of the data storage element 325 are coupled to data bit lines 231a and 231b via pass gates 328 and 329, respectively, and the non-inverting node 336 and inverting node 337 of the mask storage element 335 are coupled to the mask bit lines 233a and 233b via pass gates 340 and 341, respectively. The gate terminal of each pass gate 328, 329, 340 and 341 is coupled to word line, $WL_0$ (or, in the case of other CAM cells, $211_1$-$211_{N-1}$, to word lines $WL_1$-$WL_{N-1}$, respectively). By this arrangement, when a given word line is activated, the pass gates coupled the word line are switched to a conducting state to enable access to the data storage element 325 via data bit lines 231 and to enable access to the mask storage element 335 via mask bit lines 233.

As an example of a read operation within the embodiment of FIG. 7, assuming that the data bit lines 231 and mask bit lines 233 are precharged to logic-high levels (i.e., by the bit-line precharge circuit 224) and that a logic '1' is stored within the data storage element 325 of CAM cell $211_0$. In that case, the inverting node 327 of the data storage element 325 is at a logic-low level, and the non-inverting node 326 of the data storage element 325 is at a logic-high level. Consequently, when word line $WL_0$ is activated, the inverting node 327 of the data storage 325 element draws a small current from the bit-line precharge circuit 324 via mask bit line 233b, pulling down the mask bit line 233b in accordance with the resistance of the bit-line precharge circuit 224 and thus developing a differential mask signal on the mask bit lines 233a and 233b (i.e., because mask bit line 233a remains substantially at the precharged level). The logic low node of the data storage element 325 similarly acts to pull down one of the data bit lines 231a or 232b to develop a differential data signal on the data bit line pair. In the embodiment of FIG. 7, the bit-line driver/amplifier 310 includes a single sense amplifier 315 (SA) which receives either the differential mask signal or the differential data signal via multiplexers 314a and 314b according to the state of an access type signal 322 (AT). The access type signal 322 may be generated, for example, by the instruction decoder according to whether an incoming read instruction indicates a mask read or data read operation. The sense amplifier 315 amplifies the selected differential signal to a logic level signal that may be output from the CAM device (e.g., on data bus 208 of FIG. 4) and/or provided to other circuitry within the CAM device (e.g., error checking circuitry).

In an alternative embodiment, separate sense amplifiers 315 may be provided for the data bit lines 231 and mask bit lines 233 within each CAM column, thereby enabling both mask and data values to be read at the same time. Also, instead of separate mask and data bit lines 231 and 233, a single pair of bit lines may be multiplexed and separate mask and data word lines provided for each CAM row to enable the contents of either the mask storage elements or the data storage elements onto the shared bit lines.

During a single-row or multi-row write operation, a write enable signal 338 (WE) is asserted to enable a pair of line drivers LD 311a and 311b (referred to collectively herein as a differential driver 311) within the bit-line driver/amplifier 310 to output a differential signal representative of a write bit 339 (provided to line drivers 311a and 311b as complementary values WB 339a and /WB 339b) onto the data bit lines 231 or mask bit lines 233. Consequently, when a single word line is activated by the address logic (i.e., as part of a single-row write operation), the write value represented by the differential signals present on the data bit lines and/or mask bit lines is stored within the mask or data storage elements coupled to the activated word line. When multiple word lines are activated as part of a multi-row write operation, the write value is stored within the storage elements coupled to each of the activated word lines. In one embodiment, described in further detail below, the multi-row write signal 325 is provided to line drivers 311a and 311b to enable increased current draw (or increased current delivery) during multi-row write operations.

In the embodiment of FIG. 7, multiplexers 312a and 312b are provided to route the differential signal generated by the differential driver 311 onto either the data bit lines 231 or the mask bit lines 233 according to the state of the access type signal 322. Accordingly, in a single-row or multi-row mask write operation, only the mask bit lines 233 are driven by the differential driver 311, and the data bit lines 231 remain nominally at their precharged levels. Conversely, in a data write operation, only the data bit lines 231 are driven by the differential driver 311, and the mask bit lines 233 remain nominally at their precharged levels. In an alternative embodiment, separate differential drivers 311 may be provided for the data bit lines and mask bit lines, thereby enabling both pairs of bit lines to be driven at the same time and enabling simultaneous storage of data and mask words in selected write operations (e.g., single-row mask/data write operations).

FIG. 8 illustrates an embodiment of a line driver 350 that may be used within the differential driver 311 of FIG. 7 (i.e., to implement either of line drivers 311a or 311b. The line driver 350 includes a logic circuit 351, P-type MOS (PMOS) transistor 353 and N-type (NMOS) transistor 355. The source terminals of transistors 353 and 355 are coupled to a supply voltage node and ground voltage node, respectively, and the drain terminals of transistors 353 and 355 are coupled to one another to form the output node 356 of the line driver circuit 350. The gate terminals of transistors 353 and 355 are coupled to receive control signals A and B, respectively, from the logic circuit 351. In one embodiment, the logic circuit 351 generates control signals A and B according to the state of the write enable signal 338 (WE) and write bit 339 (WB) as shown at 357. That is, when the write enable signal 338 is low, control signals A and B are high and low, respectively, thereby switching both transistors 353 and 355 off (i.e., to a substantially non-conducting state) and rendering the line driver output in a high-impedance state. In the high-impedance state, the line driver 350 allows the bit line to which the line driver circuit is coupled to be pulled-up to a logic-high level by the bit-line pre-charge circuit (i.e., element 224 of FIG. 7) or pulled-down by a data or mask storage element in a read operation. When the write enable signal 338 is high, control signals A and B are both driven to either a logic low or logic high state according to the state of write bit 339, thus switching on one of transistors 353, 355 and switching off the other. More specifically, when the write enable signal 338 is high and the write bit 339 is high, control signals A and B are both driven low to switch on transistor 353 and switch off transistor 355 and thereby drive a logic-high signal onto the bit line coupled to output node 356 (i.e., switchably coupling the bit line to a logic-high voltage node). Conversely, when the write enable signal 338 is high and the write bit 339 is low, control signals A and B are both driven high to switch on transistor 355 and switch off transistor 353 and thereby drive a logic-low signal onto the bit line coupled to output node 356 (i.e., switchably coupling the bit line to a logic-low voltage node to discharge the bit line). As shown in FIG. 7, the line drivers 311a and 311b receive complementary write bits 339a and 339b so that when one of the line drivers drives a logic-high signal onto a bit line, the other drives a logic-low signal on the counterpart bit line to effect a differential signal.

Increased Bit Line Charging and Discharging Currents

Referring to FIGS. 7 and 8, when the differential driver 311 is enabled to drive a differential signal onto the bit lines, whichever of the line drivers 311a or 311b is to drive the logic-low level component of the differential signal should pull the corresponding bit line low enough to absorb the charge transferred onto the bit line by a logic high output from the storage element coupled to the activated word line. That is, to flip the state of a storage element coupled to an activated word line, the line driver 311a/311b driving low level component of the differential signal sinks enough current to counteract the pull-up effect of the precharge circuit and the storage element being written, such current being referred to herein as a flip current, $I_{FL}$. In the case of a multi-row write operation, the worst-case (i.e., highest) flip current is increased relative to a single-row write due to the increased number of storage elements switchably coupled to the low-drive bit line (i.e., the largest magnitude flip current being required when the data state in all such storage elements is being flipped in the multi-row write operation). Accordingly, in one embodiment of line driver 350, the current sinking transistor 355 is designed to draw enough current to flip the state of up to K storage elements (thus writing to K storage elements simultaneously, where K is the maximum number of rows that may be written in a multi-row write operation) as opposed to simply enough current to flip the state of one storage element. The increased current draw may be achieved by coupling multiple current-sinking transistors in parallel or increasing the gain (e.g., by increasing the width/length ratio) of transistor 355.

FIG. 9 illustrates an alternative embodiment of a line driver that may be used within the differential driver of FIG. 7. In the alternative line driver embodiment of FIG. 9, current draw may be selectively increased according to whether a multi-row write is being performed, thus avoiding unnecessary power consumption in single-row write operations. In the line driver 370 of FIG. 9, for example, one or more additional current-sinking transistors 377 are coupled in parallel with transistor 355 and controlled by a third control signal, C. A control logic circuit 371 generates control signals A and B in the manner described in reference to FIG. 8 (with control signal B being used to switch on a current-sinking transistor 355 appropriately sized to flip the state of a single storage element), and additionally raises control signal C, as shown in table 379, when the multi-row write signal 225 is asserted and a logic low write bit 339 is to driven onto the bit line coupled to output node 378. That is, control signal C is raised during a multi-row write operation to provide the additional current draw ($I_{BST}$) that may be needed to meet the worst-case flip current. In other line driver embodiments, the pull-up transistor 353 of FIG. 8 may be increased in size to provide additional bit line charging current if needed or desired in a multi-row write operation. Similarly, an additional transistor (or transistors) may be coupled in parallel with transistor 353 of line driver 370 to enable additional charging current to be provided during multi-row write operations, with a lower charging current (i.e., provided via transistor 353) delivered during single-row write operations.

Boosted Precharge

As discussed above, when a differential signal is driven onto the data bit lines 231 or mask bit lines 233 in the embodiment of FIG. 7, the non-driven pair of bit lines remains nominally at its precharged level. Because both the data and mask storage elements coupled to the activated word line are switchably coupled to the corresponding bit line pair, however, one bit line of the non-driven bit line pair will be pulled down by the logic-low node of the non-targeted storage element (i.e., whichever of the data and mask storage elements is not being written). In the case of a single-row write operation, only one non-targeted storage element is switchably coupled to the non-driven bit lines so that the low-going non-driven line cannot affect the state of storage elements in other CAM rows. In a multi-row write operation, however, multiple non-targeted storage elements are switchably coupled to the non-driven bit lines and, depending on the pattern of '1's and '0's stored within the non-targeted storage elements, may discharge one of the non-driven bit lines sufficiently to effect an inadvertent data write in another of the non-targeted storage elements. Referring to FIG. 7, for example, in a multi-row mask write operation directed to sixteen rows of CAM cells 211, if fifteen of the data storage elements 325 contain logic '1' values and one of the data storage elements 325 contains a logic '0' value, the combined bit line discharge effect of the inverting nodes 327 (i.e., logic '0' nodes) of the fifteen same-state data storage elements 325 may sufficiently discharge data bit line 231b to flip the state of the data storage element 325 containing the logic '0' value (i.e., because the logic high inverting node 327 of such data storage element may be pulled low by the combined pull-down effect of the other fifteen data storage elements), corrupting the corresponding data base entry. In one embodiment, such unintended data writes are avoided by boosting (i.e., increasing) the charging current supplied to the data bit lines by the bit-line precharge circuit 224 during a multi-row write operation. Thus, as shown in FIG. 7, the multi-row write signal 225 (MRW) is provided to the data bit line precharge elements (PC) 305a and 305b within bit-line precharge circuit 224 to enable the charging current to be responsively increased. In alternative embodiments, bit line precharge elements (PC) 307a and 307b may also receive the multi-row write signal 225 to provide additional charging current to non-driven match lines in a multi-row write operation. For example, in one embodiment word lines extend across multiple CAM arrays with only one (or at least less than all) of the CAM arrays being selected to participate in a multi-row write operation. In such an embodiment, it may be desirable to boost the charging current on all the bit lines of the unselected CAM arrays (i.e., match bit lines and data bit lines) to avoid unintended writes. Similarly, in a segmented CAM array embodiment (i.e., each row of CAM cells selectively segmented into multiple rows), only one or at least less than all of the segments may be selected to participate in a write operation so that it may be necessary or desirable to boost the charging current on all the bit lines of the unselected segments. In all such embodiments, decode signals may be provided to the precharge circuit 224 to enable boosted charging current only in unselected CAM arrays and/or unselected segments of a CAM array).

FIG. 10 illustrates an embodiment of a precharge element 400 that may be used to implement the data bit line precharge elements 305a, 305b (and, optionally, the match line precharge elements 307a, 307b) within the bit-line precharge circuit 224 of FIG. 7. The precharge element 400 includes PMOS transistors 401, 403 and 405 coupled in parallel with one another between a supply voltage ($V_S$), and the bit line to be charged 407. The gate terminal of transistor 401 is coupled to ground (or another bias voltage) and is sized to deliver a predetermined charging current to the bit line 407. The gate terminal of transistor 403 is coupled to receive a pulsed-precharge signal 402 (i.e., an active low signal, /PPC), and the gate terminal of transistor 405 is coupled to receive an active low version of the multi-row write signal 225. During normal read and write operations, transistor 403 is switched on briefly (i.e., by briefly driving the pulse-precharge signal low) to deliver a burst of charging current to the bit line 407 and thereby more quickly restore the bit line 407 to a desired voltage level in preparation for a subsequent read or write operation. During a multi-row write operation, transistor 405 is switched on in response to assertion of the multi-row write signal to supply an additional charging current, $I_{PCB}$, to a non-driven bit line 407 to counteract the pull-down effected by non-targeted storage elements (thus effecting multiple charging rates). The multi-row write signal may be logically combined with decoded select signals (e.g., segment select, array select, etc.) to enable the additional charging current to be selectively provided to mask bit lines in non-driven segments of a CAM array or non-selected CAM arrays within a multi-array CAM device. Also, in an alternative embodiment, transistor 403 may be switched on in response to both the low-going pulse-precharge signal 402 and assertion of the multi-row write signal. In such an embodiment, transistor 405 being omitted altogether or being switched on in combination with transistor 403 during a multi-row write operation. More generally, any circuit for selectively delivering additional charging current to non-driven bit lines during a multi-row write operation may be used in alternative embodiments.

FIG. 11 illustrates an embodiment of a current sinking circuit 420 that may be used within the line driver 370 of FIG. 9 (e.g., in place of the current sinking transistor 377) to enable selection of different levels of added discharge current, $I_{BST}$, in accordance with the number of rows selected to participate in a multi-row write operation (thus effecting multiple discharge rates). As discussed above, the number of rows selected to participate in a multi-row write (i.e., the group-size) may be specified as part of a multi-row write instruction (i.e., in the operation code or operand) and/or may be established by programming a mode value within a configuration circuit (e.g., configuration circuit 212 of FIG. 4). In the particular embodiment of FIG. 11, group sizes of four, eight and sixteen rows are signaled by group-size signals x4, x8 and x16, respectively. When the x4 signal and control signal (C) are asserted, AND gate 421 and OR gate 424 operate to switch on transistor 427, thus providing a first level of additional discharge current within a line driver. When the x8 signal and control signal C are asserted, AND gate 422 and OR gates 424 and 425 operate to switch on transistors 427 and 429, providing a second, higher level of additional discharge current, and when the x16 signal and control signal C are asserted, AND gate 423 and OR gates 424 and 425 operate to switch on transistors 427, 429 and 431, thereby providing a third, yet-higher level additional discharge current. In one embodiment, transistors 427 and 429 are the same size (i.e., have the same gain) and transistor 431 has twice the gain of transistor 429 (transistor 431 being illustrated in FIG. 11 by a common-gate transistor pair) to provide for an approximately doubled level of $I_{BST}$ for each doubling of the group size. Different circuit arrangements for providing different levels of additional discharge currents may be used in alternative embodiments, and more or fewer group-size signals may be provided.

FIG. 12 illustrates a current sourcing circuit 450 that operates in substantially the same manner as the current sinking circuit of FIG. 11 to provide different levels of additional charging current ($I_{PCB}$) within the precharge circuit of FIG. 10 (e.g., by substituting circuit 450 for transistor 405). That is, AND gates 451, 452 and 453, and NOR gates 454 and 455 respond to group-size signals x4, x8 and x16 and the multi-row write signal (MRW) by selectively switching on transistors 457, 459 and 461 to establish different levels of additional bit line charging current.

The section headings provided in this detailed description are for convenience of reference only, and in no way define, limit, construe or describe the scope or extent of such sections. Also, while the invention has been described with reference to specific embodiments thereof, it will be evident that various modifications and changes may be made thereto without departing from the broader spirit and scope of the invention. The specification and drawings are, accordingly, to be regarded in an illustrative rather than restrictive sense.

What is claimed is:

1. A content addressable memory (CAM) device having multiple write modes, the CAM device comprising:
    a CAM array including a plurality of CAM cells and word lines coupled to respective rows of the CAM cells;
    a configuration circuit to output a multi-row write signal in either a first state or a second state according to whether a mode value programmed within the configuration circuit indicates a multi-row write mode or a single-row write mode; and
    an address circuit coupled to the CAM array, wherein the address circuit comprises a control input to receive the multi-row write signal and wherein the address circuit is configured to activate a plurality of the word lines simultaneously to enable a write value to be stored within a selected plurality of the rows of CAM cells if the multi-row write signal is in the first state and is configured to activate only one of the word lines to enable the write value to be stored within a selected one of the rows of the CAM cells if the multi-row write signal is in the second state.

2. The CAM device of claim 1 wherein each of the CAM cells comprises a mask storage element and a data storage element.

3. The CAM device of claim 2 wherein at least one of the mask storage element and the data storage element comprises back-to-back coupled inverters.

4. The CAM device of claim 1 wherein the address circuit comprises an address input to receive an address value, the address value including at least enough bits to indicate the plurality of word lines.

5. The CAM device of claim 4 further comprising an interface to receive the address value from an external device.

6. The CAM device of claim 4 further comprising a priority encoder to generate the address value.

7. The CAM device of claim 1 wherein the address circuit comprises an address input to receive an address value, the address value including at least enough bits to indicate the one of the word lines.

8. The CAM device of claim 1 further comprising an instruction decoder to generate the multi-row write signal in either the first state or a second state according to whether an incoming instruction indicates a multi-row write operation.

9. The CAM device of claim 1 further comprising:
    a first plurality of bit line pairs coupled to respective columns of the CAM cells to conduct the write value to the selected plurality of the rows of CAM cells; and
    a second plurality of bit line pairs coupled to respective columns of the CAM cells.

10. The CAM device of claim 9 further comprising a first precharge circuit coupled respectively to the second plurality of bit line pairs, wherein the first precharge circuit is configured to transfer charge to the second plurality of bit line pairs at either a first charging rate or a second charging rate based, at least in part, on whether the multi-row write signal is in the first state or a second state.

11. The CAM device of claim 9 wherein each of the CAM cells includes a data storage element and a mask storage element, and wherein each of the second plurality of bit line pairs is coupled to the data storage elements within the CAM cells of the respective column and wherein each of the first plurality of bit line pairs is coupled to the mask storage elements within the CAM cells of the respective column.

12. The CAM device of claim 11 wherein the write value is a mask value.

13. The CAM device of claim 11 further comprising a write driver circuit to output the write value onto the first plurality of bit lines, and wherein the write driver circuit is configured to discharge selected bit lines of the first plurality of bit line pairs at either a first discharge rate or a second discharge rate based, at least in part, on whether the multi-row write signal is in the first state or a second state.

14. The CAM device of claim 11 further comprising a write driver circuit to output the write value onto the first plurality of bit line pairs, the write driver circuit including a discharge circuit to simultaneously discharge output nodes of a plurality of the mask storage elements.

15. A method of operation within a content addressable memory (CAM) device, the method comprising:
    programming a mode value within the configuration circuit indicating a multi-row write mode or a single-row write mode, wherein the configuration circuit outputs a multi-row write signal in either a first state or a second state, respectively;
    simultaneously activating a selected plurality of word lines coupled to respective rows of CAM cells if the multi-row write signal is in the first state;
    outputting a write value onto a first plurality of bit lines to store the write value in the rows of CAM cells coupled to the selected plurality of word lines;
    activating only one of the word lines coupled to respective rows of CAM cells if the multi-row write signal is in the second state; and outputting a write value onto a first plurality of bit lines to store the write value in the row of CAM cells coupled to the selected word line.

16. The method of claim 15 further comprising receiving a write address that indicates the selected plurality of word lines.

17. The method of claim 15 further comprising:
receiving a write instruction; and
generating the multi-row write signal in either the first state or a second state according to the write instruction.

18. The method of claim 15 further comprising transferring charge to a second plurality of bit lines coupled to the CAM cells at a first rate if the multi-row write signal is in the first state and at a second, slower rate if the multi-row write signal is in a second state.

19. The method of claim 15 wherein outputting the write value onto the first plurality of bit lines comprises drawing charge from the first plurality of bit lines at a first rate, the method further comprising drawing charge from the first plurality of bit lines at a second, slower rate if the multi-row write signal is in a second state.

20. The method of claim 15 wherein outputting a write value onto the first plurality of bit lines to store the write value in the rows of CAM cells comprises outputting a mask value onto the first plurality of bit lines to store the mask value in mask storage elements within the rows of CAM cells.

21. The method of claim 20 further comprising outputting a data value onto a second plurality of bit lines to store the data value in a selected one of the rows of CAM cells.

22. The method of claim 15 wherein the CAM cells each comprise a mask storage element and a data storage element.

23. The method of claim 15 wherein at least one of the mask storage element and the data storage element comprises back-to-back coupled inverters.

24. A method of controlling a content addressable memory (CAM) device, the method comprising:
transmitting a first mask value and a multi-row write instruction to the CAM device, indicating a multi-row write mode, to enable the CAM device to store the mask value in a plurality of first rows of CAM cells within the CAM device; and
transmitting a second mask value and a single-row write instruction to the CAM device, indicating a single-row write mode, to enable the CAM device to store the mask value in a second row of CAM cells within the CAM device.

25. The method of claim 24 further comprising transmitting a first address value to the CAM device, the first address value indicating the plurality of first rows of CAM cells.

26. A method of controlling a content addressable memory (CAM) device, the method comprising:
transmitting a control value to the CAM device;
transmitting a configuration instruction to the CAM device to enable the CAM device to store the control value in a configuration circuit of the CAM device, the control value, when in a first state, enabling circuitry within the CAM device to store a write value in a plurality of rows of CAM cells within the CAM device in response to a single write instruction; and
transmitting a configuration instruction to the CAM device to enable the CAM device to store the control value in a configuration circuit of the CAM device, the control value, when in a second state, enabling circuitry within the CAM device to store a write value in one of the rows of CAM cells within the CAM device in response to a single write instruction.

27. The method of claim 26 wherein the write value is a mask value.

* * * * *